United States Patent
Hathaway et al.

(10) Patent No.: US 7,082,065 B2
(45) Date of Patent: Jul. 25, 2006

(54) METHOD AND APPARATUS FOR EFFICIENT UTILIZATION OF ELECTRONIC FUSE SOURCE CONNECTIONS

(75) Inventors: David James Hathaway, Underhill, VT (US); Steven Joseph Urish, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,430

(22) Filed: Sep. 17, 2004

(65) Prior Publication Data

US 2006/0091904 A1    May 4, 2006

(51) Int. Cl.
*G11C 29/00* (2006.01)
(52) U.S. Cl. .................... 365/200; 365/225.7
(58) Field of Classification Search ............... 365/52, 365/200, 225.7, 51, 63
See application file for complete search history.

(56) References Cited

U.S. PATENT DOCUMENTS

| | | | |
|---|---|---|---|
| 6,363,020 B1 * | 3/2002 | Shubat et al. | 365/225.7 |
| 6,804,156 B1 * | 10/2004 | Ito | 365/200 |
| 6,822,912 B1 * | 11/2004 | Shimizu et al. | 365/200 |
| 6,856,569 B1 * | 2/2005 | Nelson et al. | 365/225.7 |
| 6,882,583 B1 * | 4/2005 | Gorman et al. | 365/200 |
| 6,937,533 B1 * | 8/2005 | Hojo et al. | 365/200 |
| 6,956,783 B1 * | 10/2005 | Ikuta et al. | 365/200 |

* cited by examiner

*Primary Examiner*—Trong Phan
(74) *Attorney, Agent, or Firm*—Whitham, Curtis, Christofferson & Cook, PC; Richard M. Kotulak

(57) ABSTRACT

A method for and an apparatus in which the FSOURCE connection in a fuse domain is split into multiple nets, allowing flexible placement of primary fuses in the floorplan, is provided. In particular, multiple FSOURCE connections (e.g. C4 pads or wire pads) are provided in the floorplan, allowing flexible placement of primary fuses without additional overhead.

21 Claims, 6 Drawing Sheets

1. Determine P and N.

P = number of primary fuse macros
   N = maximum allowable number of primary fuse macros per FSOURCE connection 2. Compare P and N and create FSOURCE C4s.

If P<N, create one FSOURCE C4
   If P>N, create P/N (rounded up to nearest whole number) FSOURCE C4s 3. Divide primary fuse macros among FSOURCE C4s.

4. Floorplan the chip.

If normal floorplanning constraints cannot be met, go on to step 5.

5. Increase number of FSOURCE C4s by one.

6. Divide primary fuse macros among FSOURCE C4s.

7. Repeat steps 4-6 until normal floorplanning constraints are met in Step 5.

*Figure 6*

METHOD AND APPARATUS FOR EFFICIENT UTILIZATION OF ELECTRONIC FUSE SOURCE CONNECTIONS

BACKGROUND OF INVENTION

1. Field of the Invention

The invention generally relates to the placement of fuses in a semiconductor floorplan. In particular, the invention provides a method for and an apparatus in which the FSOURCE connection is split into multiple nets, allowing more efficient placement of primary fuses in the floorplan and reliable programming thereof.

2. Background of the Invention

The advent of electronic fuses for connecting or disabling redundant structures in, for example, RAMs has introduced many new problems for the physical design of integrated circuits that use redundant structures to improve manufacturing yield. One such problem is the electrical constraints on the FSOURCE net. FSOURCE ports are the chip interface ports (e.g. wirebond pads, C4 pads, or the like) that supply the voltage necessary to blow each fuse in a fuse macro. While C4 pads are preferred and the terminology "C4 pads" is used hereinafter, it should be understood that any other interface port structure (such as wirebond pads) may be used. For example, in some integrated circuits, a fuse domain includes the following elements:

1. a single fuse controller to control all the fuse macros
2. up to 64 primary fuse macros for wafer level fuse blow
3. 4 secondary fuse macros for module level fuse blow
4. 2 tertiary fuse macros
5. a single FSOURCE IO that supplies current from a chip signal IO to all the fuse macros during fuse blow.

The wire associated with the FSOURCE is referred to as a "fatwire" (depicted as a relatively heavier connections in the Figures) because the type of wire used in an FSOURCE connection which has a width that can be over 100 times that of a minimum width wire in the circuit in order to carry sufficient current while limiting voltage drop per unit length during programming of fuses.

During manufacturing tests, only one fuse macro in a domain is blown at a time. In order to ensure sufficient voltage to blow a fuse inside a fuse macro, the point to point resistance between the fuse macro and the FSOURCE fatwire IO must be considered. For example, in some systems, this point to point resistance must be held to about 10 ohms. In order to meet this resistance constraint, even considering the cross sectional dimensions of the fatwire, the fuse macro must be located relatively close to the FSOURCE fatwire IO. For a full domain of 70 fuse macros (64 primary+4 secondary+2 tertiary), this means that all the fuse macros must cluster near the FSOURCE fatwire IO. This requirement can cause several floorplanning problems during physical layout of the chip because such a cluster of fuse domain blocks takes up a relatively large area on the chip, typically about 2 mm×2 mm of surface area. Associated problems include:

1. Fuses and their placement are not critical in terms of performance of the chip, yet they must cluster as a large composite block. This cluster can perturb the placement of more critical blocks resulting in a less than ideal floorplan.

2. This large cluster can block the area under signal C4 pads and leave no room for IO cells, for example, for loading signals on or off. Placing an IO cell too far away from its C4 pad will violate the resistance constraint on the connection between the IO cell and its C4 pad. This can render the signal C4 pad unusable. Thus, it is desirable to spread out the fuse macros instead of clustering them.

The prior art has thus far failed to provide a solution to the problems associated with efficient placement of fuse macros on the floorplan of a semiconductor chip.

SUMMARY OF INVENTION

The present invention provides a solution for the floorplanning problems associated with placement of fuses on a semiconductor chip. According to the practice of the invention, instead of breaking up an entire fuse domain into multiple domains in order to provide flexibility of floorplanning, the FSOURCE connection associated with the fuse domain is split into multiple nets. In other words, in the practice of the present invention, a fuse domain may contain a plurality of FSOURCE IO cells, and a primary fuse macro within a domain may be connected to any of the FSOURCE IO cells in the domain. Therefore, a fuse macro (primary, secondary, or tertiary) may be located at any distance from the fuse controller, and provision must be made only for the wire that connect the distal fuse macro to the fuse controller (plus the additional FSOURCE IO cell and C4 pad, both of which are co-located with the distal primary fuse macro). Fuse macros in a fuse domain thus are relatively mobile and may be flexibly located on a microchip without increasing the number of fuse controllers and attendant overhead. As illustrated in FIG. 5, only the wire connecting the fuse controller to the distal primary fuse macro traverses the area occupied by a placement obstruction, and the distal primary fuse macro and its supplemental FSOURCE IO cell and C4 pad are placed well outside the placement obstruction.

It is an object of this invention to provide a method for increasing the flexibility of placement of primary fuse macros on a microchip. The method includes the steps of: providing components of a fuse domain (the components including one or more primary fuse macros, overhead associated with the one or more primary fuse macros, and one or more primary FSOURCE interface port structures); arranging the components on the microchip such that at least one of the one or more primary fuse macros is located excessively distal from the one or more primary FSOURCE interface port structures; and providing at least one supplemental FSOURCE interface port structure. The at least one supplemental FSOURCE interface port structure is located proximate to and is operatively connected to the one or more excessively distal primary fuse macros.

In one embodiment of the method, the overhead comprises a fuse controller, one or more secondary fuse macros, and one or more tertiary fuse macros. The one or more primary FSOURCE interface port structures and the at least one supplemental FSOURCE interface port structure may be a C4 pad, or, alternatively, a wire bond pad. According to one embodiment of the method, the fuse domain components comprise 64 primary fuse macros, 4 secondary fuse macros, and 2 tertiary fuse macros. Further, the at least one supplemental FSOURCE interface port structure may be operatively connected to a plurality of excessively distal primary fuse macros.

The invention further provides a microchip which includes: components of a fuse domain (the components comprising one or more primary fuse macros, overhead associated with said one or more primary fuse macros, and one or more primary FSOURCE interface port structures; and at least one of the one or more primary fuse macros is located excessively distal from the one or more primary FSOURCE interface port structures); and at least one supplemental FSOURCE interface port structure that is located proximate to and is operatively connected to the one or more excessively distal primary fuse macros.

In one embodiment of the invention, the overhead of the microchip comprises a fuse controller, one or more secondary fuse macros, and one or more tertiary fuse macros. The one or more primary FSOURCE interface port structures and the at least one supplemental FSOURCE interface port structure may be a C4 pad, or, alternatively, a wire bond pad. According to one embodiment of the method, the fuse domain components comprise 64 primary fuse macros, 4 secondary fuse macros, and 2 tertiary fuse macros. Further, the at least one supplemental FSOURCE interface port structure may be operatively connected to a plurality of excessively distal primary fuse macros.

The invention further provides a method for blowing fuses within a fuse domain in parallel. The method comprises the steps of: providing components of a fuse domain, (the components including one or more primary fuse macros, overhead associated with the one or more primary fuse macros, and one or more primary FSOURCE interface port structures); arranging the components on the microchip such that at least one of the one or more primary fuse macros is located excessively distal from the one or more primary FSOURCE interface port structures; providing at least one supplemental FSOURCE interface port structure (the at least one supplemental FSOURCE interface port structure is located proximate to and is operatively connected to the one or more excessively distal primary fuse macros); and simultaneously blowing at least two fuses of the fuse domain, wherein each of the at least two fuses is operatively connected to a different FSOURCE interface port structure within the domain.

In one embodiment of the method, the overhead comprises a fuse controller, one or more secondary fuse macros, and one or more tertiary fuse macros. The one or more primary FSOURCE interface port structures and the at least one supplemental FSOURCE interface port structure may be a C4 pad, or, alternatively, a wire bond pad. According to one embodiment of the method, the fuse domain components comprise 64 primary fuse macros, 4 secondary fuse macros, and 2 tertiary fuse macros. Further, the at least one supplemental FSOURCE interface port structure may be operatively connected to a plurality of excessively distal primary fuse macros.

The present invention further provides an integrated circuit. The integrated circuit comprises: a domain of functional elements (including a circuit to said functional elements and a first off-chip connection for said domain of functional elements, and in which at least one of the functional elements is excessively distal from the first off-chip connection); and a second off-chip connection proximal to the at least one functional element which is excessively distal from the first off-chip connection. In one embodiment of the invention, the functional elements of the integrated circuit are primary fuse macros. In another embodiment, the first and second off-chip connections are FSOURCE interface port structures (e.g. C4 pads or wire bond pads).

BRIEF DESCRIPTION OF DRAWINGS

FIG. 6 illustrates the general algorithm for software used in chip floorplanning.

DETAILED DESCRIPTION

The present invention provides a solution for the floorplanning problems associated with placement of fuses on a semiconductor chip. According to the practice of the invention, instead of breaking up the entire fuse domain into multiple domains, only the FSOURCE connection is split into multiple nets. In other words, a fuse domain may contain multiple FSOURCE fatwire IOs, and a fuse macro within a domain may be connected to any of the FSOURCE fatwire IOs in the domain. However, the fuse macros may not cross domains to connect to an FSOURCE fatwire IO in another domain and only one fuse controller is required.

In the present context, it is recognized that each FSOURCE fatwire IO cell has an associated C4 pad. The terms FSOURCE fatwire IO, FSOURCE IO fatwire cell, FSOURCE IO, and FSOURCE C4 are used interchangeably and are meant to include both an FSOURCE fatwire IO cell and its associated C4 pad.

The present invention allows the desired granularity of fuse macro placement without adding the overhead of creating multiple fuse domains (another fuse macro, 4 secondary fuse macros, 2 tertiary fuse macros, and fuse controller). The only extra overhead is the additional FSOURCE IOs and their associated C4 pads, which are also required in the arrangements of FIGS. 3 and 4.

Figure 1:
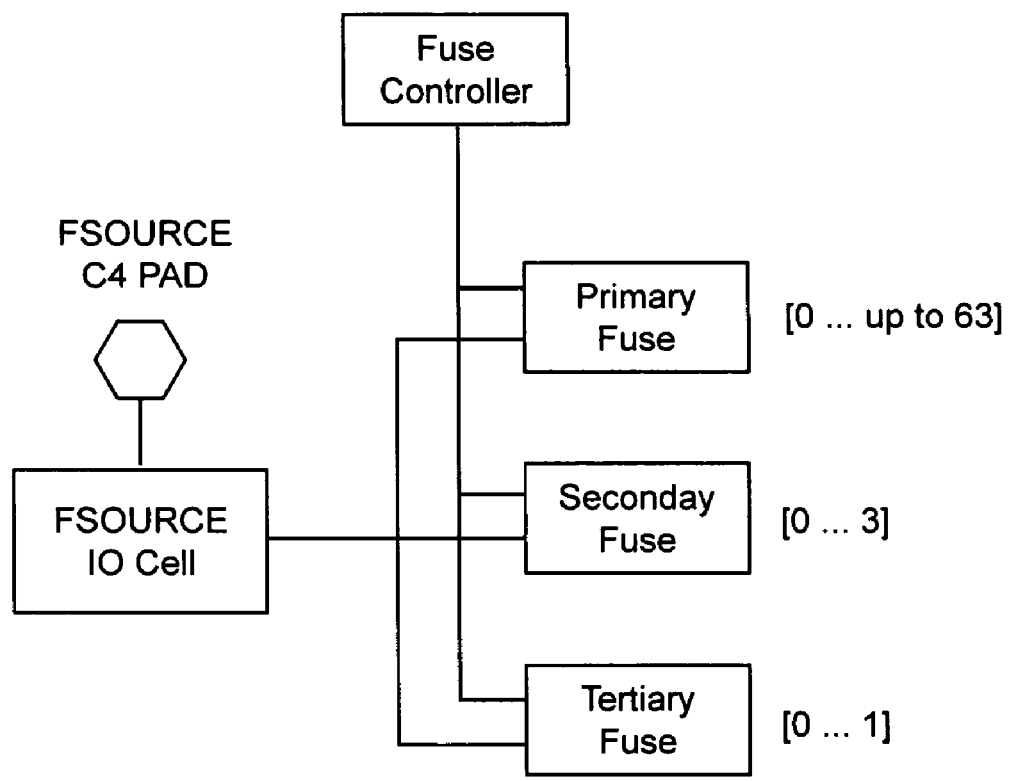
FIG. 1. Schematic depiction of a domain.

The typical arrangement of a fuse domain is depicted schematically in FIG. 1 which shows a single fuse controller connected to primary, secondary and tertiary fuse macros which may contain up to 63, 3 and 1 (e.g. 0–63, 0–3 and 0–1, respectively) additional macros each, giving a total of 64, 4 and 2 macros each, respectively. As can be seen in the figure, the primary, secondary and tertiary fuse macros are connected to a single FSOURCE IO cell, which is in turn connected to an FSOURCE C4 pad. In general, an electronic fuse domain will contain a set of primary fuses, an FSOURCE power connection, and other overhead.

Figure 2:
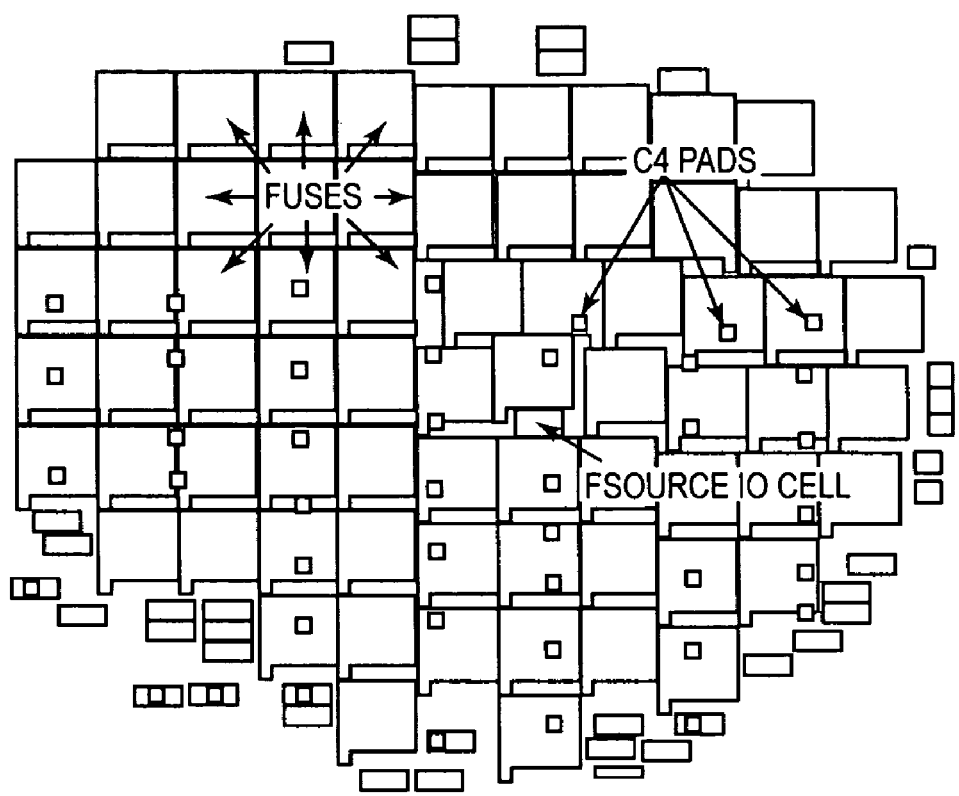
FIG. 2. Schematic representation of the typical placement of a fuse domain that clusters around an FSOURCE fatwire IO cell.

FIG. 2 illustrates typical placement of a fuse domain that clusters around an FSOURCE IO cell. As can be seen, the cluster of fuses is so dense that IO cells cannot be placed near the C4 pads on top of this cluster and must be located at a distance. Because the distance from the C4 pads to any IO cell is so large in this arrangement, the resistance through a wire connecting a C4 pad to an IO cell is too great to make the C4 pad usable.

Figure 3:
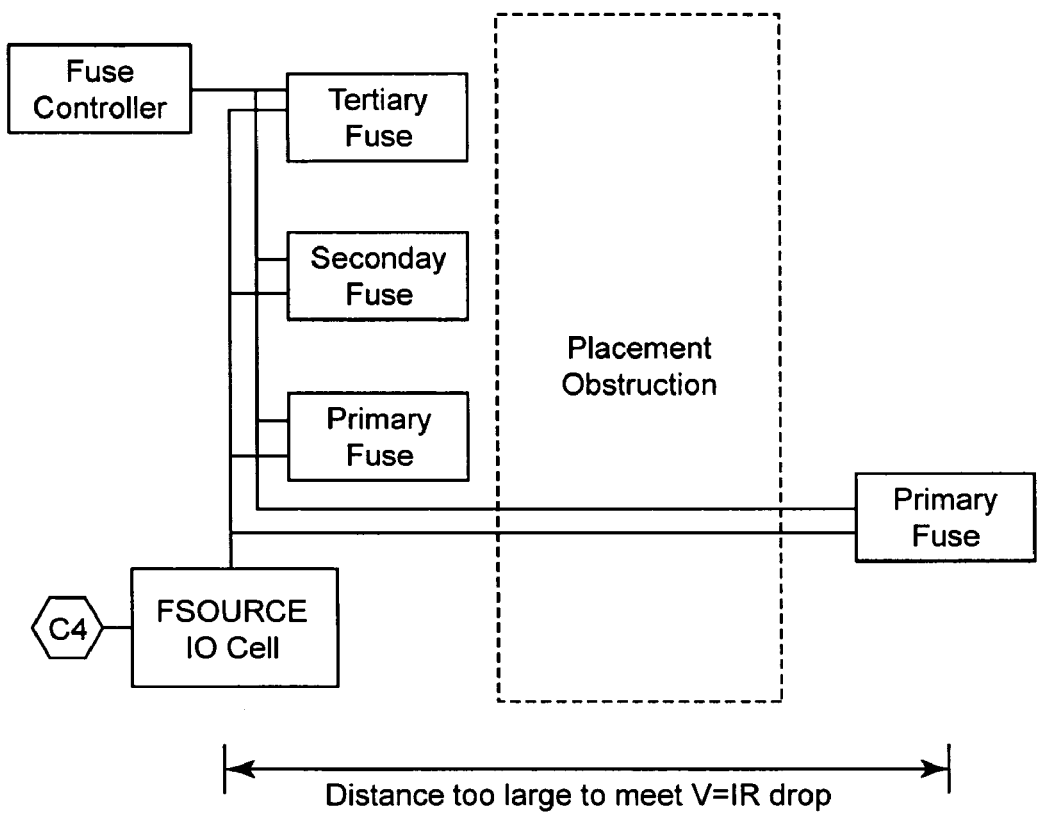
FIG. 3 illustrates that case where a large placement obstruction is located at a position where it would be preferable to locate primary fuse macro.

FIG. 3 further and more generally illustrates this problem. In FIG. 3, a large placement obstruction (for example, a fixed block or a group of fixed blocks such as a group of IO cells) is located at a position where it would be preferable to locate primary fuse macros. Since the fuse macro once programmed has no effect on the functionality of the chip, in theory its placement away from the other fuses and on the other side of the placement obstruction, as shown, is allowable. However, placement of the primary fuse macro at this location makes the distance from the fuse macro to the FSOURCE IO cell too great to meet voltage drop requirements (i.e. the distance is too large or "excessively distal" to meet the V=IR drop adequate for reliable fuse programming, or, more generally, to reliably perform any other functions, for example, due to noise, signal propagation, time, etc.). As a result the fuses inside an excessively distal fuse macro may fail to be blown during testing.

Figure 4:
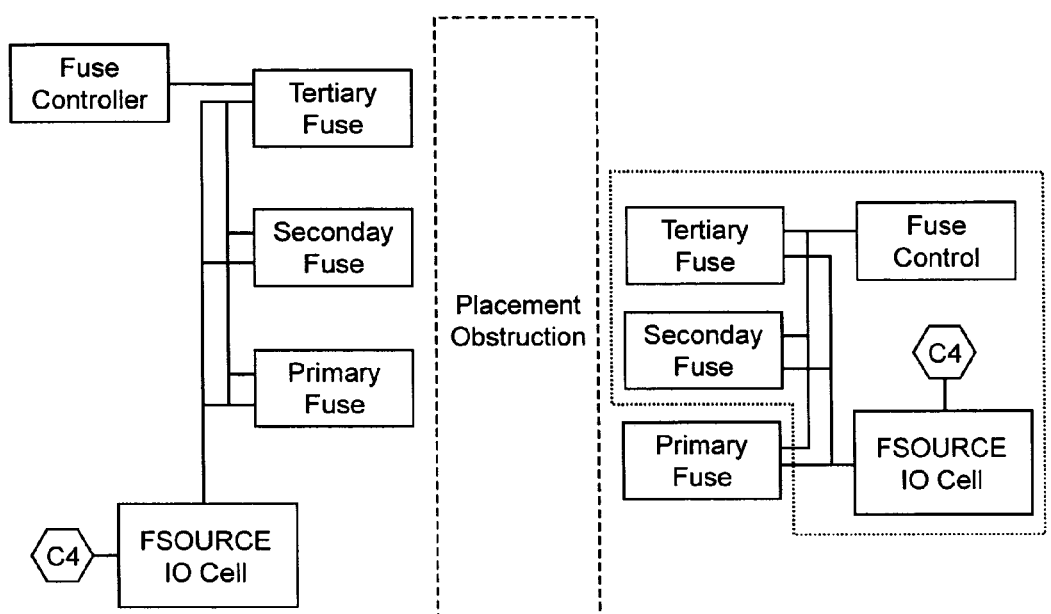
FIG. 4 illustrates two separate fuse domains located on opposite sides of a placement obstruction.

One potential solution to the problem illustrated in FIG. 3 is to split the fuse domain into multiple domains as shown in FIG. 4. For example, if a single domain is split into two domains, instead of dealing with one large cluster of fuse macros that must be placed very close together around one FSOURCE IO cell, two smaller clusters of fuse macros may be placed around two FSOURCE IO cells. These smaller clusters can be placed independently and may be spaced further apart within a cluster. FIG. 4 illustrates this possibility, showing two separate fuse domains located on opposite sides of a placement obstruction. While this solution alleviates some of the floorplanning problems caused by utilizing a single large cluster, this type of design also has some drawbacks. For example:

1. In addition to the primary fuse macros, each domain requires one fuse controller, one FSOURCE fatwire IO, 4 secondary fuse macros, and 2 tertiary fuse macros. Therefore, splitting a full domain of 64 primary fuse macros into two domains of 32 primary fuse macros (or other allocations) adds all the overhead of a fuse domain, i.e. a second fuse controller, a second FSOURCE fatwire IO cell, 4 additional secondary fuse macros, and 2 additional tertiary fuse macros. (In FIG. 4, this overhead is simplified and depicted as a fuse controller, an FSOURCE fatwire IO cell, a single primary fuse macro, a single secondary fuse macro, and a single tertiary fuse macro.)

2. Fuse domains may not share fuse macros. If one domain uses all of its fuses and the other domain is using none, the domain that is fully utilized cannot use any of the macros from the empty domain if it should require more fuses. This scenario could lead to discarding product that might otherwise have been repaired, since defects on a chip tend to cluster in regions.

Figure 5:
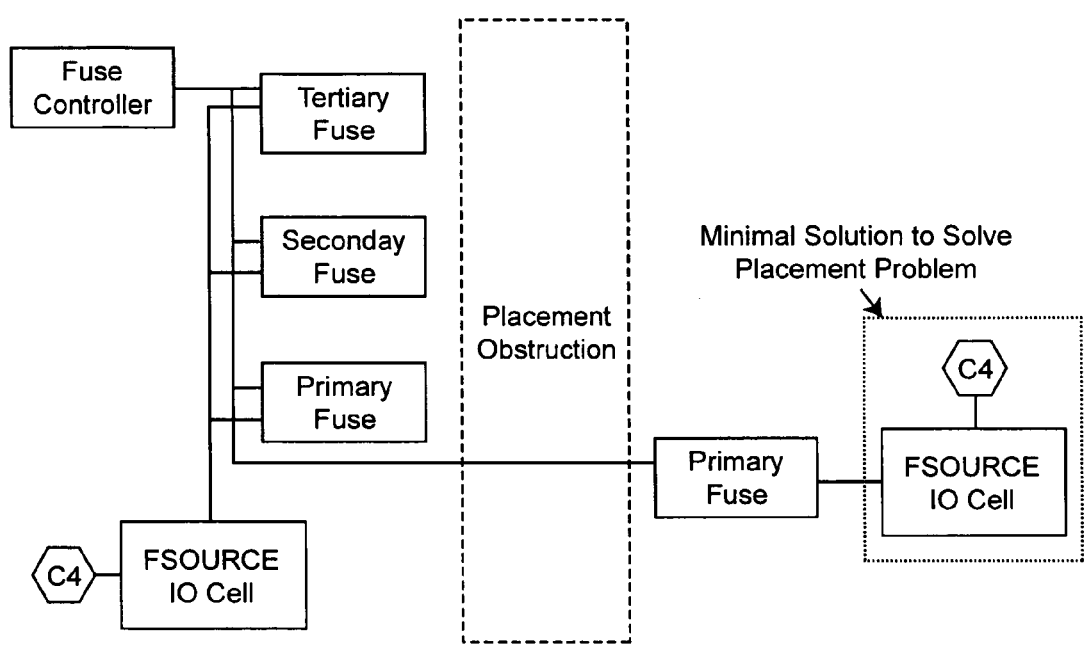
FIG. 5 illustrates incorporation of a second FSOURCE IO fatwire cell into a fuse domain design.

FIG. 5 is a schematic depiction of one embodiment of the present invention, in which the minimal solution required to solve a fuse placement problem is illustrated. As can be seen in FIG. 5, one primary fuse macro is located at a distance from the other fuse macros in the domain due to a placement obstruction. A similar scenario was depicted in FIG. 3; however, in FIG. 3, the distance between the distal fuse macro and the FSOURCE IO cell was too great to allow the distal fuse to be reliably utilized. Problems associated with routing a fatwire are crowding on the chip surface and the inability to blow a fuse located at a distance. In contrast, in the practice of the present invention, the distal primary fuse macro may be utilized because a second, supplemental FSOURCE IO cell is incorporated into the fuse domain design. The supplemental FSOURCE IO cell is proximate to (e.g. within a distance that suitably limits the v=IR voltage drop so that it is not "excessively distal") and operatively connected to the distal primary fuse macro. As used herein, "operatively connected" means that the FSOURCE IO cell is connected to the distal primary fuse macro in a manner that allows the FSOURCE IO cell to carry out its normal function, i.e. to provide current to blow the primary fuse macro. As can be seen, the only additional overhead required to permit movement of the primary fuse macro to the distal site is the second FSOURCE IO cell and the associated C4 pad. Thus, by including additional FSOURCE IO cells in the design of a fuse domain, it is possible to place primary fuse macros at convenient locations on the semiconductor chip.

The fuse controller can control fuse programming over a normal (e.g. not a fatwire) connector since control currents are small.

In a preferred embodiment, the present invention will be implemented in fuse insertion software. The software is modified to break up the fuses in the fuse domain into a user-specified number of subgroups. Each subgroup of fuses is connected to its own FSOURCE IO cell. A threshold will be used to determine the maximum number of fuse macros per subgroup during fuse insertion. This threshold will be set to a default for each new design and can be changed based on learning during floorplanning for the next iteration of the design.

A software algorithm for determining the maximum number of fuse macros per subgroup assumes that a fuse domain contains the following components:

A single fuse controller macro

A single FSOURCE C4 pad

A single fatwire IO cell

N number of primary fuse macros

Fuse domain overhead (secondary fuses, tertiary fuses, etc . . . )

The general algorithm for software used in chip floorplanning is illustrated in FIG. 6, and is described in detail as follows:

1. Determine P and N.

Determine the number of primary fuse macros P required for the design based on the amount RAM present in the design. Those of skill in the art will recognize that the number of primary fuse macros typically increases as the amount of RAM increases. Let N be the maximum allowable primary fuse macros per FSOURCE connection. N is determined by experience or rule of thumb, as some number less than the maximum number of primary fuse macros allowable in a domain that can be successfully floorplanned on an average design. This means that on an average design, an FSOURCE fatwire IO may connect to up to N primary fuse macros without overly perturbing the floorplan of critical logic or without causing any fuse macro to become excessively distal from its associated FSOURCE connection.

2. Compare P and N and create fuse macros.

In general, if the number of primary fuse macros, P, required for the design is less than N (P<N), then the software creates one FSOURCE C4. However, if the number of primary fuse macros required by the design is greater than N (P>N), additional FSOURCE C4s are created by the software. The total number of FSOURCE C4s created initially is P/N, rounded up to the nearest whole number.

3. Divide primary fuse macros among FSOURCE C4s.

The primary fuse macros are divided among the FSOURCE C4s that are created initially. Division of the primary fuse macros can be done in any suitable manner. For example, the division may either be done randomly or in the order in which the fuse macros are inserted into the netlist. Those of skill in the art will recognize that the method of division is not critical since the affinity of the fuse macros is to the FSOURCE C4 itself, not to each other. Also, it is possible later to reconnect fuse macros to the nearest FSOURCE based on placement as long the FSOURCE is within the same domain. In a preferred embodiment, the primary fuse macros are divided evenly among the FSOURCE C4s and fatwire IO cells, or as near evenly as possible if even division is not possible (e.g. if there is an odd number of fuse macros).

4. Floorplan the chip.

If the normal floorplanning constraints (timing, IO wiring, etc.) cannot be met due to the FSOURCE constraints, go on to step 5.

5. Increase the number of FSOURCE C4s by 1.

6. Divide the primary fuse macros among the FSOURCE C4s (as described in step 1).

7. Repeat steps 4–6 until normal floorplanning constraints are met in step 4.

Repetition of steps 4–6 may be carried out as many times as is necessary until normal floorplanning constraints are met.

For example, according to a floorplanning software system, the default number of primary fuse macros per FSOURCE C4 in a floorplan is 32 (i.e. N=32). If the number of primary fuse macros (P) required in a floorplan is less than 32, one FSOURCE C4 is created by the software. However, if the number of primary fuse macros P required in a floorplan is greater than 32, P/N (rounded up to the nearest whole number) FSOURCE C4s are created by the software and the fuse macros are divided among them. Floorplanning is then undertaken.

If it is discovered through floorplanning that even more FSOURCE C4s are required in order to physically spread out the fuse macros sufficiently, the number of FSOURCE C4s for the domain is increased, the number of primary fuse macros per FSOURCE is decreased, and the software is rerun.

Another benefit of the fuse domain design of the present invention is that fuses inside a single domain but connected to different FSOURCEs can be blown in parallel, by suitable fuse controller design, thus saving time during the fuse blow during manufacturing tests.

The foregoing examples serve to illustrate the practice of the present invention but should not be interpreted so as to limit the invention in any way.

EXAMPLES

Example 1

1) A fuse domain has 28 primary fuses, i.e. P=28. The default number of primary fuses per primary FSOURCE is 32, i.e. N=32 in the software system. The ratio of primary fuses to default primary fuses (P/N) is thus 28/32. Rounding the fraction up to the nearest whole number gives a value of 1, so this fuse domain receives 1 primary FSOURCE C4. The Fuse Macros are clustered around this single FSOURCE C4.

2) If this fuse domain grows to 35 primary fuses, then the P/N ratio becomes 35/32. Again, rounding this fraction up to the nearest whole number this time gives a value of 2. This expanded fuse domain receives two primary FSOURCE C4s. The fuse macros are clustered around their associated primary FSOURCE C4 on the chip.

3) Through floorplanning, it is determined that this domain requires an additional supplemental FSOURCE C4, or a total of 3 FSOURCE C4s. The default number of primary fuses per FSOURCE (N) is set to 15 as an input to the software. Setting N to 15 increases the number of FSOURCEs whereas changing N to 20 yields only 2 FSOURCEs. The choice of 15 is somewhat arbitrary—the desired effect is to yield 3 FSOURCEs out of the equation. The P/N ratio becomes 35/15, which when rounded up to the nearest whole number gives a value of 3. The fuse domain is assigned 3 FSOURCE C4s. The Fuse Macros are clustered around their associated FSOURCE C4 on the chip.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

What is claimed is:

1. A method for increasing flexibility of placement of primary fuse macros on a microchip, comprising the steps of:
providing components of a fuse domain, said components comprising
one or more primary fuse macros,
overhead associated with said one or more primary fuse macros, and
one or more primary FSOURCE interface port structures;
arranging said components on said microchip such that at least one of said one or more primary fuse macros is located excessively distal from said one or more primary FSOURCE interface port structures; and
providing at least one supplemental FSOURCE interface port structure, said at least one supplemental FSOURCE interface port structure being proximate to and operatively connected to said one or more excessively distal primary fuse macros.

2. The method of claim 1, wherein said overhead comprises
a fuse controller,
one or more secondary fuse macros, and
one or more tertiary fuse macros.

3. The method of claim 1 wherein said one or more primary FSOURCE interface port structures and said at least one supplemental FSOURCE interface port structure is a C4 pad.

4. The method of claim 1 wherein said one or more primary FSOURCE interface port structures and said at least one supplemental FSOURCE interface port structure is a wire bond pad.

5. The method of claim 1, wherein said fuse domain components comprise 64 primary fuse macros, 4 secondary fuse macros, and 2 tertiary fuse macros.

6. The method of claim 1 wherein said at least one supplemental FSOURCE interface port structure is operatively connected to a plurality of excessively distal primary fuse macros.

7. A microchip, comprising,
components of a fuse domain, said components comprising
one or more primary fuse macros,
overhead associated with said one or more primary fuse macros, and
one or more primary FSOURCE interface port structures;
wherein at least one of said one or more primary fuse macros is located excessively distal from said one or more primary FSOURCE interface port structures, and
at least one supplemental FSOURCE interface port structure, said at least one supplemental FSOURCE interface port structure being proximate to and operatively connected to said one or more excessively distal primary fuse macros.

8. The microchip of claim 7, wherein said overhead comprises
   a fuse controller,
   one or more secondary fuse macros, and
   one or more tertiary fuse macros.

9. The microchip of claim 7, wherein said one or more primary FSOURCE interface port structures and said at least one supplemental FSOURCE interface port structure is a C4 pad.

10. The microchip of claim 7, wherein said one or more primary FSOURCE interface port structures and said at least one supplemental FSOURCE interface port structure is a wire bond pad.

11. The microchip of claim 7, wherein said fuse domain components comprise 64 primary fuse macros, 4 secondary fuse macros, and 2 tertiary fuse macros.

12. The microchip of claim 7, wherein said at least one supplemental FSOURCE interface port structure is operatively connected to a plurality of excessively distal primary fuse macros.

13. A method for blowing fuses in parallel within a fuse domain, comprising the steps of
   providing components of a fuse domain, said components comprising
      one or more primary fuse macros,
      overhead associated with said one or more primary fuse macros, and
      one or more primary FSOURCE interface port structures;
   arranging said components on said microchip such that at least one of said one or more primary fuse macros is located excessively distal from said one or more primary FSOURCE interface port structures; and
   providing at least one supplemental FSOURCE interface port structure, said at least one supplemental FSOURCE interface port structure being proximate to and operatively connected to said one or more excessively distal primary fuse macros simultaneously blowing at least two fuses of the fuse domain, wherein each of said at least two fuses is operatively connected to a different FSOURCE interface port structure within the domain.

14. The method of claim 13, wherein said overhead comprises
   a fuse controller,
   one or more secondary fuse macros, and
   one or more tertiary fuse macros.

15. The method of claim 13 wherein said one or more primary FSOURCE interface port structures and said at least one supplemental FSOURCE interface port structure is a C4 pad.

16. The method of claim 13 wherein said one or more primary FSOURCE interface port structures and said at least one supplemental FSOURCE interface port structure is a wire bond pad.

17. The method of claim 13, wherein said fuse domain components comprise 64 primary fuse macros, 4 secondary fuse macros, and 2 tertiary fuse macros.

18. The method of claim 13 wherein said at least one supplemental FSOURCE interface port structure is operatively connected to a plurality of excessively distal primary fuse macros.

19. An integrated circuit comprising,
   a domain of functional elements including
      a circuit connected to said functional elements
      a first off-chip connection for said domain of functional elements
   wherein at least one of said functional elements is excessively distal from said first off-chip connection, and
   a second off-chip connection proximal to said at least one functional element which is excessively distal from said first off-chip connection.

20. The integrated circuit of claim 19, wherein said functional elements are primary fuse macros.

21. The integrated circuit of claim 19 wherein said first and second off-chip connections are FSOURCE interface port structures.

* * * * *